(12) United States Patent
Barmoav et al.

(10) Patent No.: US 10,271,132 B2
(45) Date of Patent: Apr. 23, 2019

(54) METHOD TO DYNAMICALLY CHANGE THE DIRECTIONAL SPEAKERS AUDIO BEAM AND LEVEL BASED ON THE END USER ACTIVITY

(71) Applicant: MOTOROLA SOLUTIONS, INC, Chicago, IL (US)

(72) Inventors: Felix Barmoav, Reshon Leziyyon (IL); Uzi Cohen, Shoham (IL); Haim Kahlon, Shoam (IL); Dori Sasson, Modi'In (IL); Alexander Shmoukler, Bat Yam (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/361,576

(22) Filed: Nov. 28, 2016

(65) Prior Publication Data
US 2018/0152783 A1    May 31, 2018

(51) Int. Cl.
| | |
|---|---|
| *H04R 1/32* | (2006.01) |
| *H03G 3/32* | (2006.01) |
| *H04R 5/02* | (2006.01) |
| *H04S 7/00* | (2006.01) |
| *H03G 3/30* | (2006.01) |
| *H04R 1/10* | (2006.01) |

(52) U.S. Cl.
CPC ........... *H04R 1/323* (2013.01); *H03G 3/3005* (2013.01); *H03G 3/32* (2013.01); *H04R 1/1041* (2013.01); *H04R 5/02* (2013.01); *H04S 7/303* (2013.01); *H04R 2430/01* (2013.01)

(58) Field of Classification Search
CPC . H03G 3/32; H04R 5/02; H04R 1/323; H04R 29/002; H04S 7/303
USPC .......................................................... 381/57
See application file for complete search history.

(56) References Cited

U.S. PATENT DOCUMENTS

| | | |
|---|---|---|
| 3,868,573 A | 2/1975 | Holcomb et al. |
| 4,084,139 A | 4/1978 | Jakobe |
| 6,363,139 B1 | 3/2002 | Zurek et al. |
| 7,388,962 B2 | 6/2008 | Cheung et al. |
| 8,208,970 B2 | 6/2012 | Cheung et al. |
| 8,855,729 B1 | 10/2014 | Pattikonda |
| 9,232,366 B1 | 1/2016 | Charlier et al. |

(Continued)

OTHER PUBLICATIONS

Bozena Smagowska and Malgorzata Pawlaczyk-Luszezynska: Effects of Ultrasonic Noise on the Human Body—A Bibliographic Review, International Journal of Occupational Safety and Ergonomics (JOSE) 2013, vol. 19, No. 2, pp. 195-202.

(Continued)

*Primary Examiner* — Paul Kim

(57) ABSTRACT

A method and personal stereo speaker system is provided for providing audio to a user. Speakers provide audio to the ears of a user. The speakers are preferably mounted on the shoulders of the user. The audio emanating from the speakers has a beam angle and an audio level. When the system detects that the head of the user has moved, either side-to-side, up and down, or rotationally, or that the user has commended moving, a controller changes at least one of the beam angle and the audio level in response to the movement. This improves the quality of the sound heard by the user and also keeps the privacy of the audio optimized.

4 Claims, 8 Drawing Sheets

(56) References Cited

U.S. PATENT DOCUMENTS

| | | | | |
|---|---|---|---|---|
| 2002/0090103 A1* | 7/2002 | Calisto, Jr. | ............. | H04B 1/086 |
| | | | | 381/333 |
| 2005/0009583 A1* | 1/2005 | Cheung | .................... | H04S 1/00 |
| | | | | 455/575.6 |
| 2012/0020480 A1* | 1/2012 | Visser | ..................... | H04R 3/12 |
| | | | | 381/17 |
| 2013/0121515 A1* | 5/2013 | Hooley | ................. | H04R 1/403 |
| | | | | 381/307 |

OTHER PUBLICATIONS

Woon-Seng Gan, Jun Yan, Tomoo Kamakura: "A review of parametric acoustic array in air", Parametric Acoustic Array: Theory, Advancement and Applications, Applied Acoustics, vol. 73, Issue 12, Dec. 2012, pp. 1211-1219.

* cited by examiner

METHOD TO DYNAMICALLY CHANGE THE DIRECTIONAL SPEAKERS AUDIO BEAM AND LEVEL BASED ON THE END USER ACTIVITY

BACKGROUND OF THE INVENTION

Public Safety officers need to have their hands free, especially in emergency situations. So requiring an office to hold his radio to remain in two-way communication with others officers and dispatchers is inefficient and also dangerous to officers.

One solution that allows officers to keep their hands free is to accessorize officers with a speaker connected to their radios. This speaker is often worn on the officer's chest and provides a speaker that incoming communications can be played on for the officer to hear. Although this frees up the officer's hands, it also hands significant drawbacks.

First, playing communications from other officers and dispatchers can give people near the officer information that they should not have. This can be, for example, information about a potential suspect that could assist that suspect or information about another person that others should not know for privacy reasons.

Further, playing communications publicly on a speaker located on a public safety officer can compromise the location of an officer, thereby making his job more dangerous.

In addition, public safety officers work in various environments that have different ambient noise levels. It is inconvenient and deleterious for an officer to have to adjust the level of volume on a speaker due to ambient noise changes, since oftentimes these noise changes occur at times when an officer most needs his hands to be free. Also, having an officer fumble for a volume switch can take his attention and even his vision from the dangerous task at hand.

For all these reasons, there is a need for method that allows a public safety officer to receive communications while allowing the officer to keep his hands free and not divulge information or the location of the officer to those around him.

BRIEF DESCRIPTION OF THE SEVERAL VIEWS OF THE DRAWINGS

The accompanying figures, where like reference numerals refer to identical or functionally similar elements throughout the separate views, which together with the detailed description below are incorporated in and form part of the specification and serve to further illustrate various embodiments of concepts that include the claimed invention, and to explain various principles and advantages of those embodiments.

Figure 1:
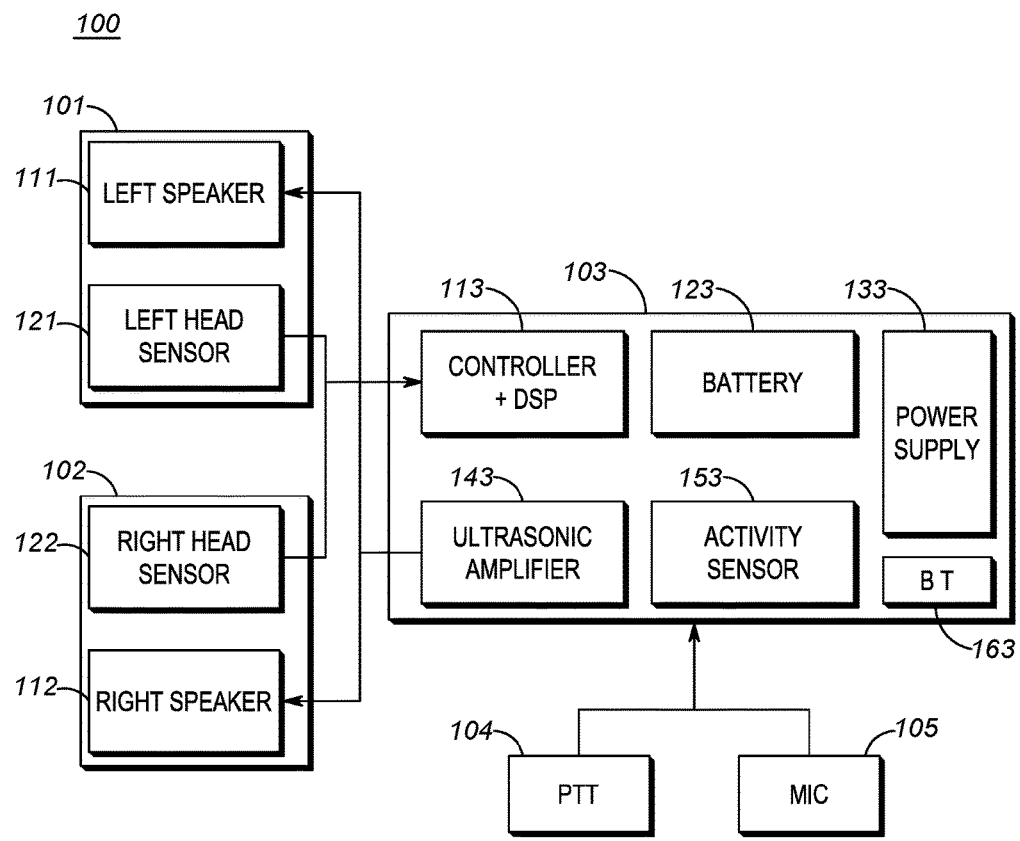
FIG. 1 depicts a system diagram illustrating speakers and a controller in accordance with an exemplary embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed is an improved method and stereo speaker system for creating a controlled, private and noise-free "audio bubble" surrounding an officer's ears by dynamically changing the audio beam angle and audio level directed to the ears based on the end user activity.

Audio is provided to a user from stereo speakers, which are preferably located on the shoulders of the officer. The audio has a beam angle and an audio level, each of which can be adjusted based upon the activity level or other ambient characteristics of the user.

Upon detecting that the head of the user has moved, at least one of the beam angle and audio level are adjusted to optimize the listening experience of the user. The head of the user can move from being in a static state to a moving position. For example, if the officer begins running after a person of interest. Upon ceasing the pursuit, the head can be detected going from a moving state to a static state, and the beam angle and audio level can be adjusted appropriately.

In addition, the officer can remain in a static position but move his head, thereby changing the location of his ears in relation to the speakers. For example, the officer can bend forward, bend backward, moved leftward, move rightward, or move rotationally.

Exemplary embodiments of the present invention also adjust the beam angle and audio lever if the user is in a noisy environment, for example by reducing the beam angle and increasing the volume of the speakers. In addition, the problem of howling, where multiple users receiving the same audio and leading to feedback issues, can be minimized by shrinking the beam angle and lowering the volume of the speakers.

All of these features allow a public safety officer to remain hands-free to deal with an incident while maintaining clean audio while continuing to hear ambient noises and sounds, since the ears of the officer are not covered by headphones or the like.

FIG. 1 depicts a system diagram 100 illustrating left speaker box 101, right speaker box 102, controller 103, Push-To-Talk (PTT) button 104, and Microphone 105 in accordance with an exemplary embodiment of the present invention. In accordance with an exemplary embodiment, left speaker box 101 is located on the left shoulder of a user and right speaker box 102 is located on the right shoulder of the user. Left speaker box 101 and right speaker box 102 can be incorporated into a vest or be independent components.

Speaker box 101 comprises left speaker 111 and left head sensor 121. Speaker box 102 comprises right speaker 112 and right head sensor 122. Left speaker 111 and right speaker 112 preferably comprise stereo directional speakers seated on shoulder straps.

Speakers 111 and 112 provide a stereo directional speaker to create a controlled, personal localized noise-free environment. In accordance with an exemplary embodiment, speaker 101 and speaker 102 are directional, or parametric, speakers based on an array of small transducers modulated with audio carried by ultrasonic wave. The transducers are also preferably receivers that receive audio, map a signal of the array to locate the ear channel, head boundary shape, and postures, and detect gestures, such as muting and unmuting.

Left head sensor 121 and right head sensor 122 detect head movement and can comprise transducers.

Controller 103 includes controller circuitry and digital signal processor (DSP) 113, battery 123, power supply 133, ultrasonic amplifier 143, activity sensor 153, and Bluetooth module 163.

Controller circuitry and DSP 113 is a specialized microprocessor optimized for the operational needs of controller 103.

Battery 123 provides power to controller 103 via the use of one or more electrochemical cells.

Power supply 133 is an electronic device that supplies electrical energy to controller 103. Power supply 133 is preferably integrated into controller 103.

Ultrasonic amplifier 143 is an electronic device that can increase the power of an audio signal. Ultrasonic amplifier 143 is preferably coupled to left speaker 111 and right speaker 112 to amplify audio signals transmitted by left speaker 111 and right speaker 112.

Activity sensor 153 detects movement of the user, such as if the user is standing, running, or struggling.

Bluetooth module 163 transmits and receives data over short distances using the Bluetooth wireless technology standard. In an exemplary embodiment, Bluetooth module 163 exchanges data with a wireless land mobile radio that is utilized by the user.

PTT button 104 provides the ability to perform Push-to-talk communications, which are conversations on half-duplex communication lines. In typical PTT communications, depressing the PTT button places the user in transmit mode, and releasing the button places the user in voice reception mode. Controller 103 preferably includes a PTT input port.

Microphone 105 is a transducer that converts sound into an electrical signal. In an exemplary embodiment, microphone 105 is a separate component that is coupled to controller 103 and linked to a land mobile radio, not shown.

Figure 2:
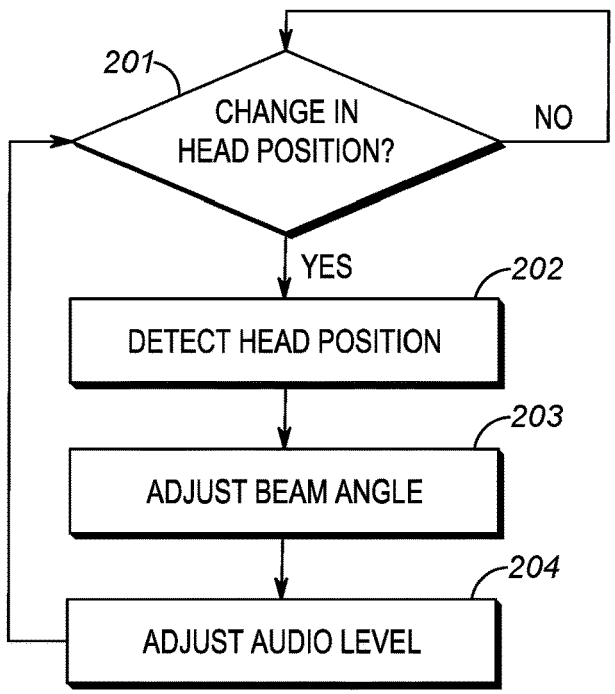
FIG. 2 depicts a flowchart of a method for dynamically changing the beam angle and audio level of directional speakers based upon head position in accordance with an exemplary embodiment of the present invention.

FIG. 2 depicts a flowchart 200 of a method for dynamically changing the beam angle and audio level of directional speakers based upon head position in accordance with an exemplary embodiment of the present invention.

Controller 103 determines (201) if there has been a change in head position of the user. In a first exemplary embodiment, head position can change due to head bending, which is moving the head from side to side such that one ear moves directly toward the near shoulder while the opposite ear moves directly away from its near shoulder. In a second exemplary embodiment, head position can change due to the head moving up or down, which is when the user moves his chin directly toward his chest, head moving down, or directly away from his chest, head moving up. This is the motion made when a person is nodding in agreement. In a third exemplary embodiment, head position can change due to head turning, which is when a user rotates his head in a clockwise or counterclockwise direction when viewed from above. This is the motion made commonly when someone is disagreeing or indication a negative response to a question.

If there has been no change in head position, the process returns to determining if there is head movement.

If it is determined at step 201 that there has been head movement of the user, controller 103 detects (202) head position. The head movement can include, inter alia, head bending, head moving up, head moving down, and head turning. Controller 103 can locate the ear and therefore appropriately aim the audio beam using methods such as a camera, a heat sensor, or any other suitable technique. Each of the head movements can lead to a change in the beam angle and audio level of speakers 101 and 102. By changing the beam angle and audio level, the ability for the officer to effectively communicate with other officers and dispatchers is greatly enhanced. Controller 103 preferably detects head movement utilizing left head sensor 121 and right head sensor 122.

Figure 4A:
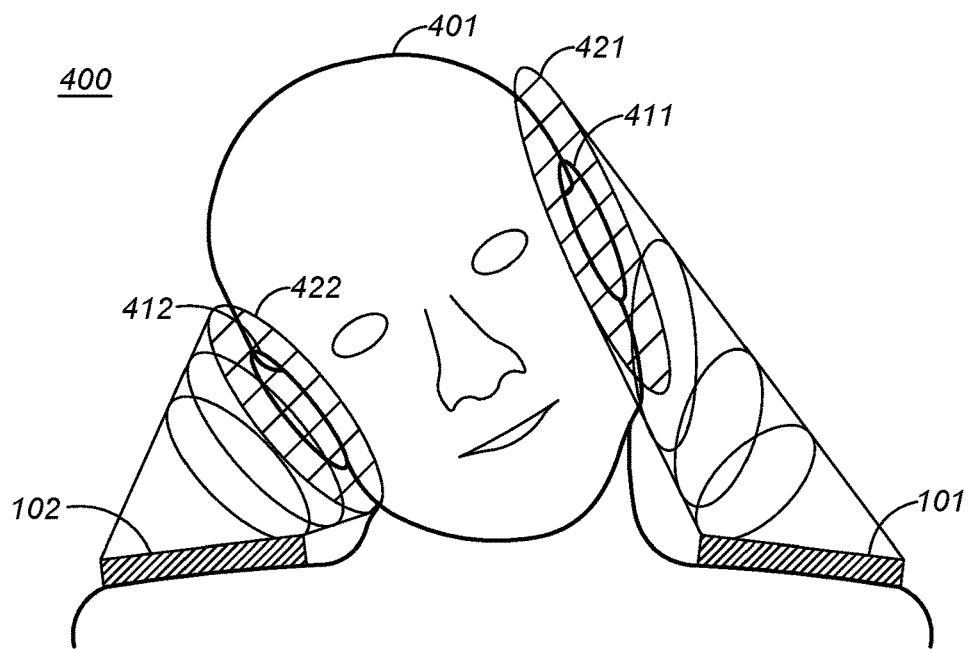
FIG. 4A depicts the beam angle from a speaker when a user moves his head to his right side in accordance with an exemplary embodiment of the present invention.
Figure 4B:
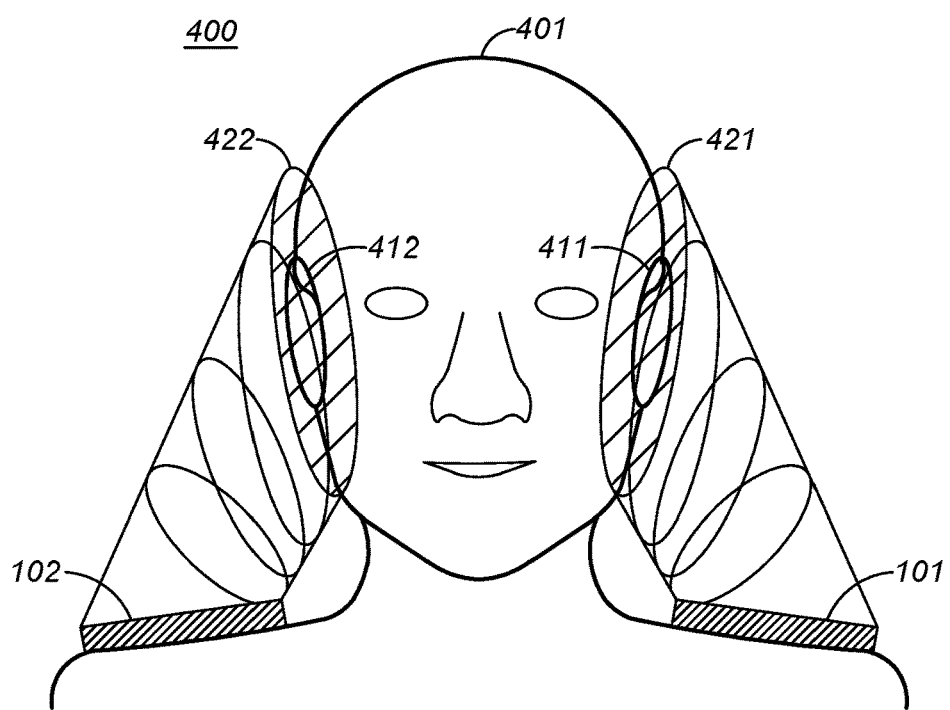
FIG. 4B depicts the beam angle from a speaker when a user moves his head to an upright position in accordance with an exemplary embodiment of the present invention.
Figure 4C:
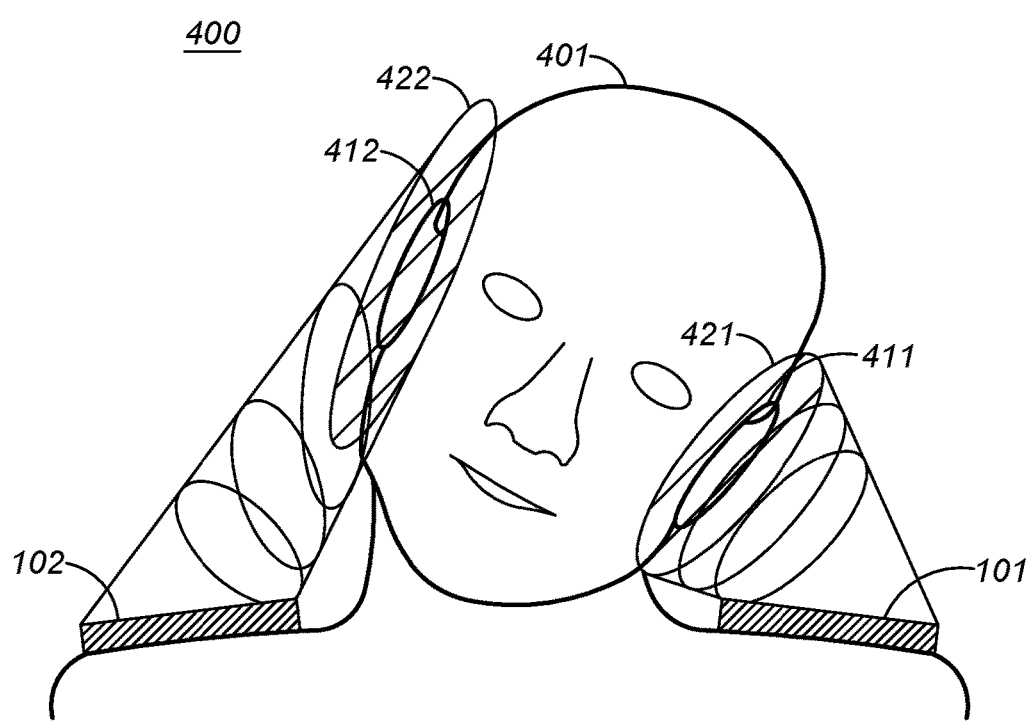
FIG. 4C depicts the beam angle from a speaker when a user moves his head to his left side in accordance with an exemplary embodiment of the present invention.

In a first exemplary embodiment, controller 103 determines that the user's head has bent, either to the left or to the right, as depicted in FIG. 4. FIG. 4 depicts the beam angle from a speaker when a user moves his head side to side in accordance with an exemplary embodiment of the present invention. If the user's head has bent to the left, as depicted in FIG. 4C, controller 103 sets left speaker 101 to a narrow beam angle 421 and a lower audio volume level and sets right speaker 102 to a wide beam angle 422 and higher audio volume. If the user's head has bent to the right, as depicted in FIG. 4A, controller 103 sets left speaker 101 to a wide beam angle 421 and a higher audio volume level and sets right speaker 102 to a narrow beam angle 422 and lower audio volume. This effectively narrows the beam angle and decreases the volume of the speaker that is now closer to an ear and widens the beam angel and increases the volume of the speaker that is now farther from an ear. This allows the user to effectively hear transmitted audio in an optimized fashion, even with his head bent. The audio level is preferably kept relatively constant in both ears.

Figure 3A:
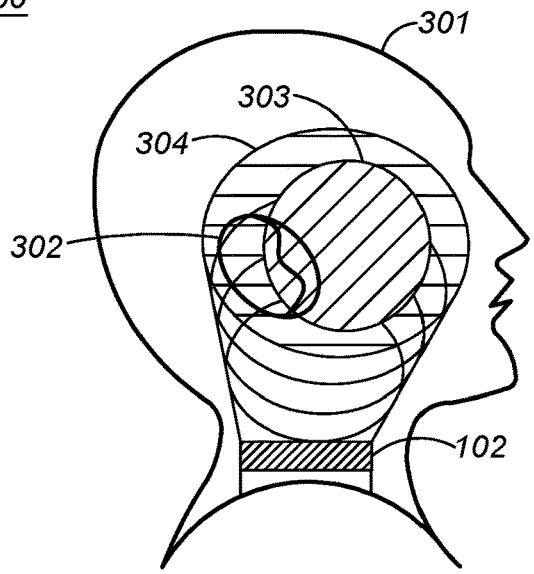
FIG. 3A depicts the beam angle from a speaker when a user moves his head backwards in accordance with an exemplary embodiment of the present invention.
Figure 3B:
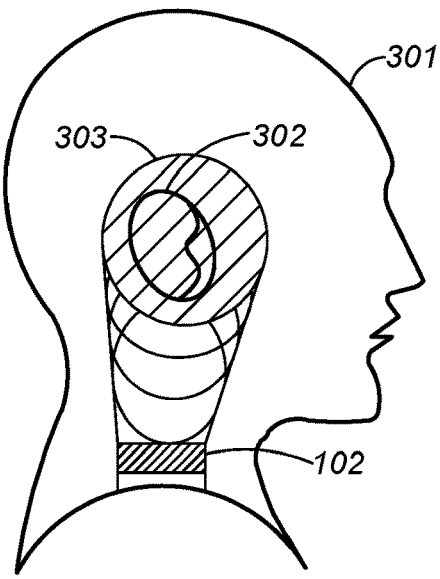
FIG. 3B depicts the beam angle from a speaker when a user moves his head to an upright position in accordance with an exemplary embodiment of the present invention.
Figure 3C:
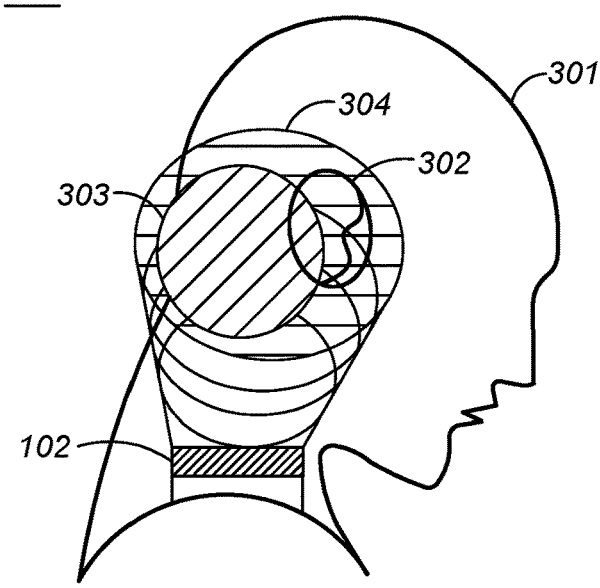
FIG. 3C depicts the beam angle from a speaker when a user moves his head forward in accordance with an exemplary embodiment of the present invention.

In a second exemplary embodiment, controller 103 determines that the user's head is moving up or down, as depicted in FIG. 3. FIG. 3 depicts the beam angle from a speaker when a user moves his head forward and backwards in accordance with an exemplary embodiment of the present invention. FIG. 3A depicts a user 300 with head 301 moving up. FIG. 3B depicts user 300 with head 301 in a normal, relaxed position. FIG. 3C depicts user 300 with head 301 moving down. In this exemplary embodiment, the beam default is narrow, but if you move head 301 the beam angle is widened to allow audio to ears 302 that moved away from the center of beam angle 303. This conserves energy and increases privacy. The resolution of the beam widening depends upon the number of transducers per area and their size. The beam also preferably be steered.

When user 300 has his head 301 in a normal, relaxed position, controller 103 sets left speaker 101 and right speaker 102 to narrow beam angles 303 and preferably keeps the audio volume level at a typical level. If the user's head moves downward, as depicted in FIG. 3C, controller 103 sets left speaker 101 and right speaker 102 to wide beam angles 304 and preferably keeps the audio volume level the same. If the user's head moves upward, as depicted in FIG. 3A, controller 103 sets left speaker 101 and right speaker 102 to wide beam angles 304 and preferably keeps the audio volume level the same. This widens the beam angle so that the user can continue to hear audio from speakers 101 and 102, since if the beam angle were not widened the narrow beam angles 303 would not completely encompass ears 302. This allows the user to effectively hear transmitted audio in an optimized fashion, even with his head moves upward or downward. The audio level is thereby preferably maintained as is, despite the head movement.

In a third exemplary embodiment, controller 103 determines that the user's head has rotationally turned, either to the left or to the right. If the user's head has rotated to the left, controller 103 sets left speaker 101 to a narrow beam angle and a lower audio volume level and sets right speaker 102 to a wide beam angle and higher audio volume. If the user's head has rotated to the right, controller 103 sets left speaker 101 to a wide beam angle and a higher audio volume level and sets right speaker 102 to a narrow beam angle and lower audio volume. This effectively narrows the beam angle and decreases the volume of the speaker that is now closer to an ear and widens the beam angel and increases the volume of the speaker that is now farther from an ear. This allows the user to effectively hear transmitted audio in an optimized fashion, even with his head bent. The audio level is preferably kept relatively constant in both ears.

Controller 103 adjusts (203) the beam angle of left speaker 111 and right speaker 112 based upon the detection of head position made in step 202. The method of changing the audio beam sweet spot can be done by various methods, such as a phase array, multiplexing the transducers, mechanically moving and aligning the transducers, or any other suitable method.

Controller 103 adjusts (204) the audio level of left speaker 111 and right speaker 112 based upon the detection of head position made in step 202.

Figure 5:
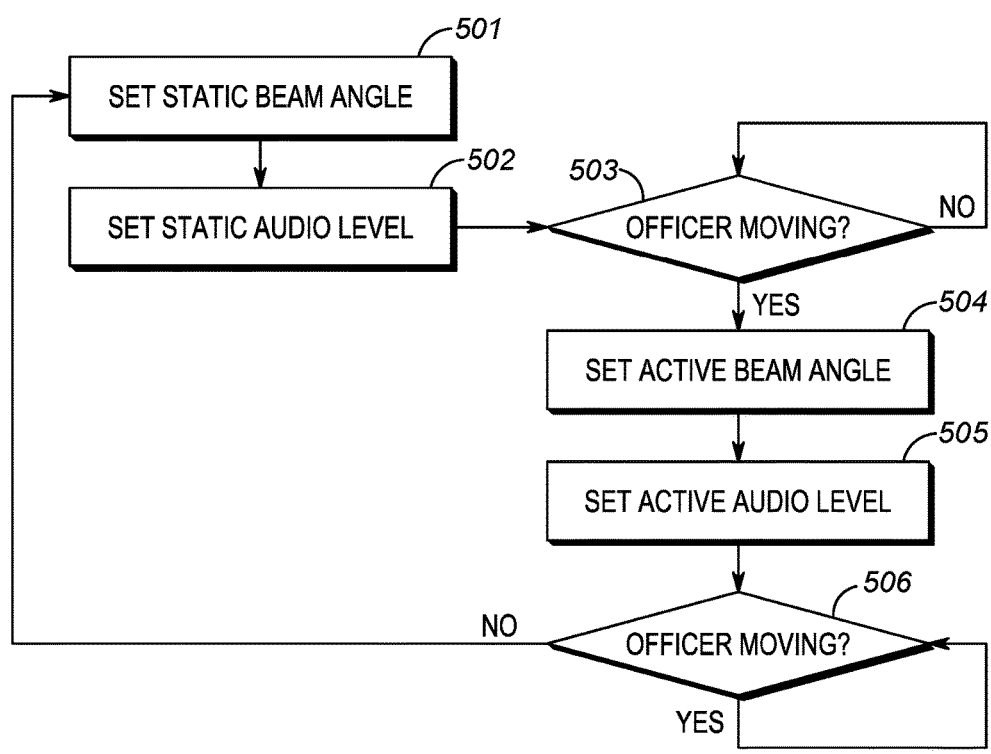
FIG. 5 depicts a flowchart of a method for dynamically changing the beam angle and audio level of directional speakers based upon whether an officer is moving or static in accordance with an exemplary embodiment of the present invention.

FIG. 5 depicts a flowchart 500 of a method for dynamically changing the beam angle and audio level of directional speakers based upon whether an officer is moving or static in accordance with an exemplary embodiment of the present invention.

In accordance with an exemplary embodiment, controller 103 sets (501) the beam angle of left speaker 101 and right speaker 102 to narrow for a static, non-moving user. Since the user is in a static state, such as standing in place, the beam angle can be set to narrow and the user can hear audio from speaker 101 and 102 adequately.

Controller 103 sets (502) the audio level for a static user. The audio level for a static user is preferably set to a lower volume level, since there are no interfering noises from moving, such as footsteps or increased breathing.

Controller 103 determines (503) if the user, in this exemplary embodiment a public safety officer, is moving. This is preferably done utilizing activity sensor 153. If not, the beam angle and audio levels for speakers 101 and 102 remain unchanged and controller 103 continues to monitor if the officer moves.

If controller 103 determines at step 503 that the officer has started moving, controller 103 sets (504) the beam angle to a level appropriate for a moving user. In this exemplary embodiment, the beam angle for both left speaker 101 and right speaker 102 is set to a wide beam angle. This increases the effective sound radius about each ear, so that even if the head moves forward or backward while moving the user's ear is remains is a good position to hear sound emanating from speakers 101 and 102. In an exemplary embodiment, the audio beam angle and audio level that creates the sweet spot is controlled and triggered by the user activity, such as running or standing, that is detected by activity sensor 153 located in the controller 103 or sensors 121 and 122 located in speaker boxed 101 and 102.

Controller 103 sets (505) the audio level to a level appropriate for a moving user. In this exemplary embodiment, the audio level is increased. This provides additional volume to compensate for the added background noise added when a user begins to move.

Controller 103 determines (506) if the officer continues to move. If the officer does continue to move, the beam angle and audio levels remain unchanged. If the officer stops moving, the process returns to step 501, and the beam angle and audio levels for speakers 101 and 102 are set to levels appropriate for a static user.

Figure 6:
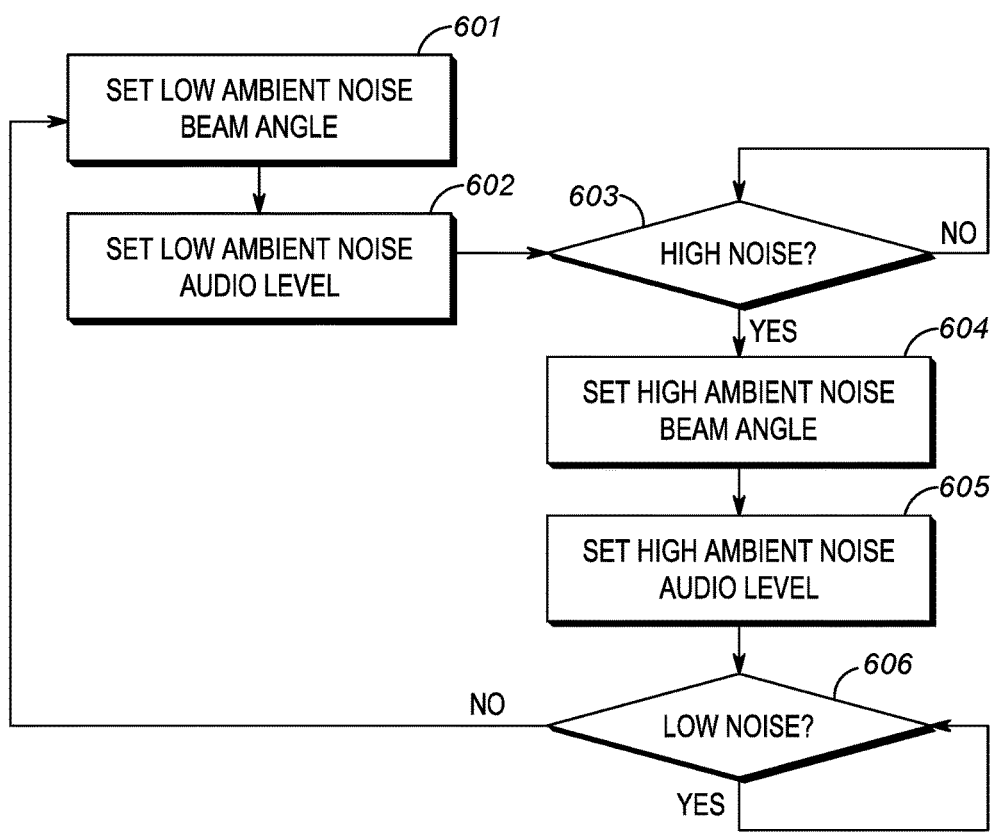
FIG. 6 depicts a flowchart of a method for dynamically changing the beam angle and audio level of directional speakers based upon the ambient noise level in accordance with an exemplary embodiment of the present invention.

FIG. 6 depicts a flowchart 600 of a method for dynamically changing the beam angle and audio level of directional speakers based upon the ambient noise level in accordance with an exemplary embodiment of the present invention.

In accordance with an exemplary embodiment, controller 103 sets (601) the beam angle of left speaker 101 and right speaker 102 to a wide beam angle for a low ambient noise environment. Since the user is in a low ambient noise environment, the beam angle can be set to narrow and the user can hear audio from speaker 101 and 102 adequately.

Controller 103 sets (602) the audio level for a low ambient noise environment. The audio level for a low ambient noise environment is preferably set to a lower volume level, since there are relatively few background noises that could prevent the user from effectively hearing audio emanating from speakers 101 and 102.

Controller 103 determines (603) if the user has moved to a high noise environment. In an exemplary embodiment, controller 103 and speaker boxes 101 and 102 include multiple microphones for sensing the ambient noise and use signal processing to cancel the noise at the sweet spot directed to the ears of the end user. High ambient noise environments are very common for public safety officers, as incident areas can become very noisy. If the user has not moved into a high noise environment, the beam angle and audio levels for speakers 101 and 102 remain unchanged and controller 103 continues to monitor if the user moves into a high noise environment.

If controller 103 determines at step 603 that the user has moved into a high noise environment, controller 103 sets (604) the beam angle to a level appropriate for a high noise environment. In this exemplary embodiment, the beam angle for both left speaker 101 and right speaker 102 is set to a narrow beam angle. This increases the focus of sound directed at the user's ears, thereby improving the ability of the user to hear audio emanating from speakers 101 and 102.

Controller 103 sets (605) the audio level to a level appropriate for a high ambient noise environment. In this exemplary embodiment, the audio level is adjusted to provide additional volume to compensate for the added background noise added when a user begins to move.

Controller 103 determines (606) if the user moves to a low noise environment. If the user remains in a high noise environment, the beam angle and audio levels remain unchanged. If the user moves to a low noise environment, or if the environment becomes a low noise environment, the process returns to step 601, and the beam angle and audio levels for speakers 101 and 102 are set to levels appropriate for a low ambient noise environment.

Figure 7:
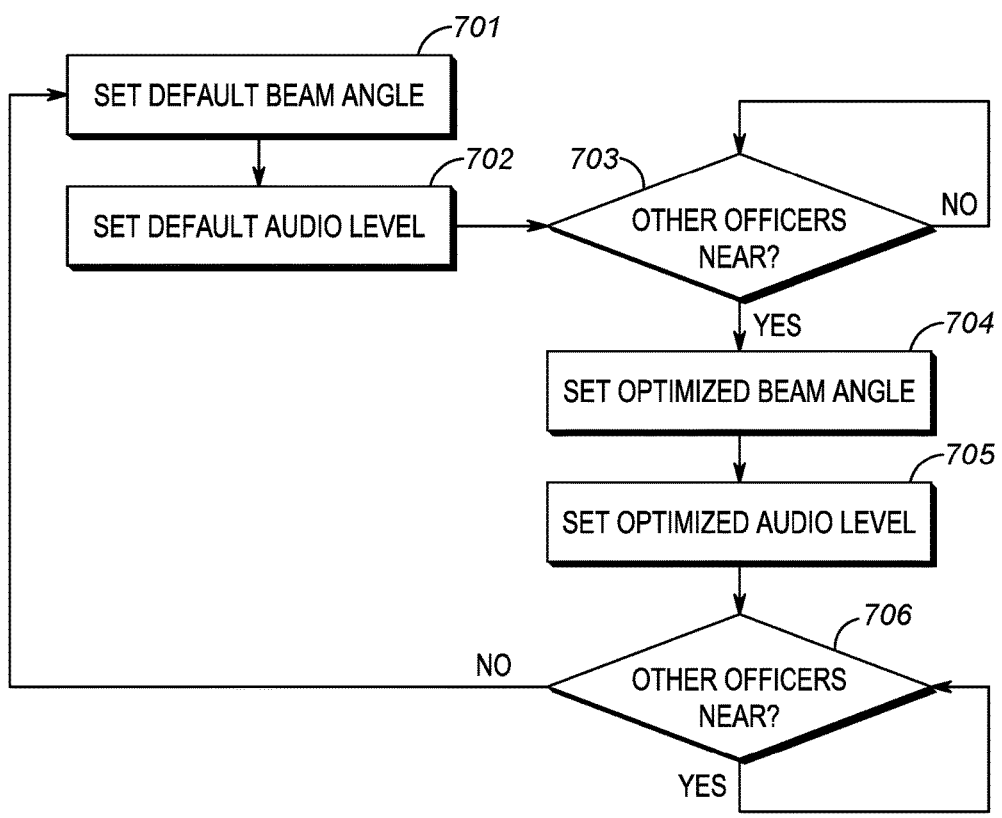
FIG. 7 depicts a flowchart of a method for dynamically changing the beam angle and audio level of directional speakers based upon whether other officers are near in accordance with an exemplary embodiment of the present invention.

FIG. 7 depicts a flowchart 700 of a method for dynamically changing the beam angle and audio level of directional speakers based upon whether other officers are near each other in accordance with an exemplary embodiment of the present invention. By changing the beam angle and audio level in this scenario so that there is no loopback between the speaker and the microphone, the incidence of howling, where multiple users are receiving and playing the same audio signal and receiving a degraded signal or feedback, is reduced or eliminated.

In accordance with an exemplary embodiment, controller 103 sets (701) the beam angle of left speaker 101 and right speaker 102 to a default beam angle. In this exemplary embodiment, the default is that the user is not proximal to other users receiving the same audio signals.

Controller 103 sets (702) the audio level to a default audio level. The default audio level is a level appropriate for the environment and assuming that there are no other users proximal to the user who are receiving the same audio signals.

Controller 103 determines (703) if other users, such as other public safety officers, are near the user. This can be accomplished using mapping software or using other suitable techniques. If there are not other officers near the user, the beam angle and audio levels for speakers 101 and 102 remain unchanged and controller 103 continues to monitor if other officers come near the user.

If controller 103 determines at step 703 that there are other officers near the user, controller 103 sets (704) the beam angle to an optimized angle for reducing howling due to multiple users receiving and playing the same audio signal in proximity to each other.

Controller 103 sets (705) the audio level to an optimized level for reducing howling due to multiple users receiving and playing the same audio signal in proximity to each other.

Controller 103 determines (706) if there continues to be other officers near the user who are receiving and playing the same audio signals. If there continues to be other officers nearby, the beam angle and audio levels remain unchanged. If there are no longer other officers receiving and playing the same audio signals near the user, the process returns to step 701, and the beam angle and audio levels for speakers 101 and 102 are set to default levels.

The result of an exemplary embodiment is a dynamic change in the directional speakers audio beam sweet spot angle and volume level directed to the ears based on the end user activity. This leads to increased privacy levels, and is therefore a good solution for covert mode operation, since no visible external wires are extending into the ears. Ambient noise cancellation is also provided as well as a decrease in howling that can occur when a user is nearby others having the same audio played on their land mobile radios.

An exemplary embodiment also provides reduced energy consumption, since narrow audio beams and lower volume levels consume less energy. Hands free operation is also enabled while in pursuit of a person of interest or in the apprehension of a person of interest, thereby increasing the safety of the officer while maintaining strong communication with other officers and the dispatcher.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized electronic processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising an electronic processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for providing audio to a user comprising:
   providing audio from a speaker worn by a user and directed toward an ear of the user, the audio comprising a beam angle and an audio level;
   determining by microphone sensors coupled to the speaker an ambient noise level near the user; and
   changing by a controller coupled to the micro hone sensors at least one of the beam angle and the audio level in response to determining the ambient noise level near the user.

2. The method of claim 1, the method further comprising the step of detecting that the head of the user has moved.

3. The method of claim 2, wherein the step of detecting that the head of the user has moved comprises detecting that the user has transitioned from a static position to a moving position.

4. The method of claim 2, wherein the step of detecting that the head of the user has moved comprises detecting that the user has transitioned from a moving position to a static position.

* * * * *